United States Patent [19]

Morris et al.

[11] Patent Number: 5,254,962
[45] Date of Patent: Oct. 19, 1993

[54] COMBINED ACOUSTIC WAVE DEVICE AND CERAMIC BLOCK FILTER STRUCTURE

[75] Inventors: Douglas A. Morris, Placitas; Raymond L. Sokola, Albuquerque, both of N. Mex.; Frederick Y. Cho, Scottsdale, Ariz.; Charles W. Shanley, Lake Zurich, Ill.

[73] Assignee: Motorola, Inc., Schaumburg, Ill.

[21] Appl. No.: 901,005

[22] Filed: Jun. 19, 1992

[51] Int. Cl.⁵ .......................... H03H 9/00; H01P 1/20
[52] U.S. Cl. ................................... 333/193; 333/206; 333/202
[58] Field of Search .............. 333/126, 129, 132, 133, 333/134, 202, 203, 204, 205, 206, 193, 194, 195, 196, 208; 455/78, 80, 82, 83; 310/36, 37, 38, 313 R

[56] References Cited

U.S. PATENT DOCUMENTS

| | | |
|---|---|---|
| 4,021,761 | 5/1977 | Morii et al. ........................ 333/193 |
| 4,162,415 | 7/1979 | Andreev et al. ................ 310/313 R |
| 4,423,395 | 12/1983 | Shirahama ......................... 333/194 |
| 4,438,417 | 3/1984 | Yamashita et al. .................. 333/193 |
| 4,468,642 | 8/1984 | Hikita ................................. 333/193 |
| 4,806,889 | 2/1989 | Nakano et al. ..................... 333/202 |
| 4,963,844 | 10/1990 | Konishi et al. ..................... 333/208 |
| 4,965,537 | 10/1990 | Kommrusch ....................... 333/202 |
| 5,023,580 | 6/1991 | Kiur et al. .......................... 333/206 |
| 5,081,435 | 1/1992 | Yorita ................................ 333/206 |
| 5,173,672 | 12/1992 | Heine ................................ 333/206 |
| 5,202,654 | 4/1993 | Heine ................................ 333/202 |

Primary Examiner—Raymond A. Nelli
Attorney, Agent, or Firm—Joseph P. Krause

[57] ABSTRACT

Surface acoustic wave devices (160) as well as other electronic devices, can be mounted into the sides of ceramic blocks (150) that comprise a ceramic block filter device. The surface acoustic wave device as mounted in the filter block does not require or displace volume that would be required to mount the surface acoustic wave devices in their own housings.

20 Claims, 1 Drawing Sheet

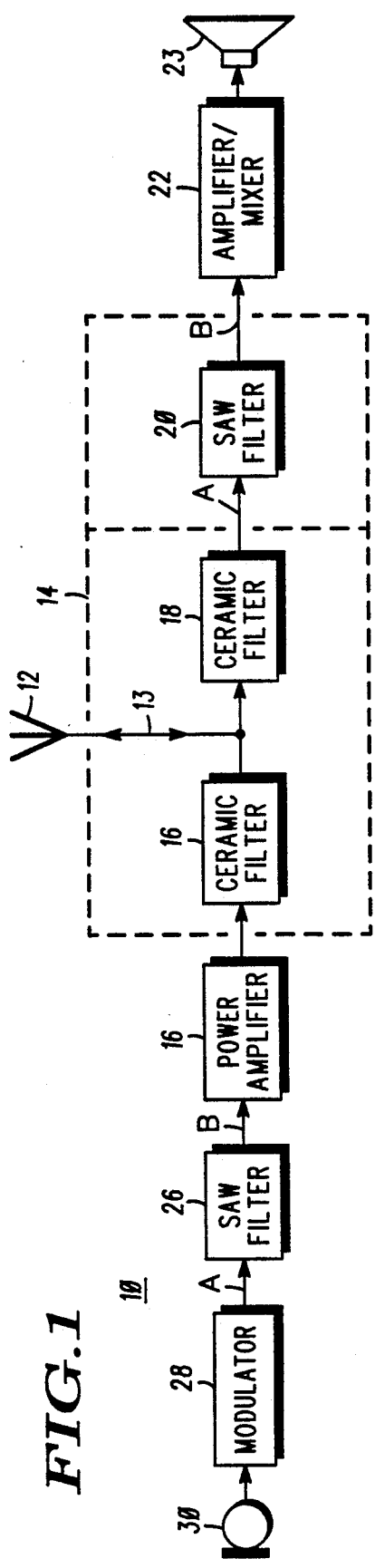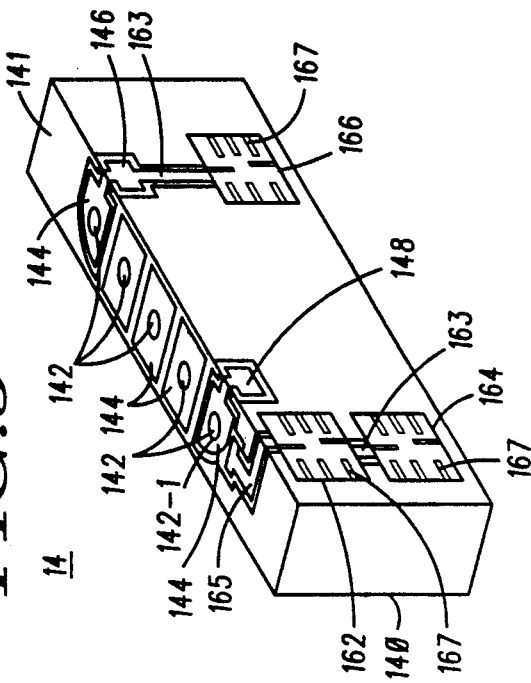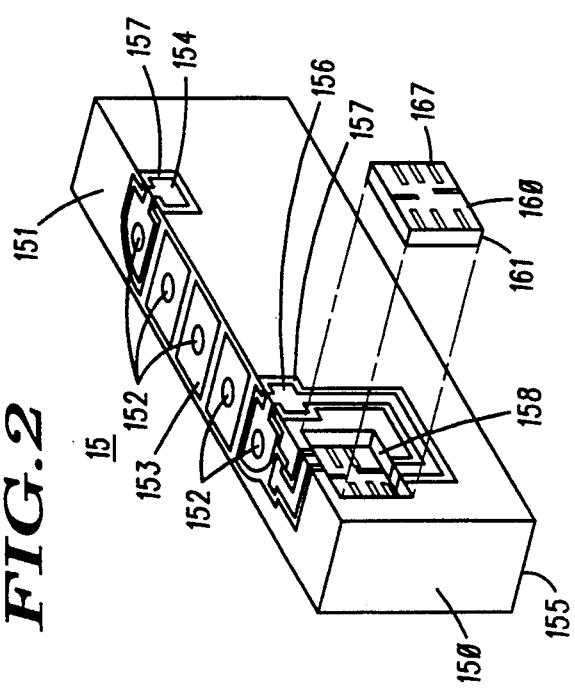

COMBINED ACOUSTIC WAVE DEVICE AND CERAMIC BLOCK FILTER STRUCTURE

FIELD OF THE INVENTION

This invention relates to electrical filters. More particularly, this invention relates to packaging for various electronic devices, such as surface acoustic wave devices, using ceramic block filters.

BACKGROUND OF THE INVENTION

Ceramic block filters are well known in the art. These devices are typically comprised of a parallelepiped-shaped block of ceramic material, through which holes extend the surfaces of which, as well as the exterior surfaces of the parallelepiped, are all covered with conductive material. One surface of the block, typically referred to as the top surface, (which is a surface orthogonal to the axes of the holes through the block) is left unmetallized. The metallization lining the holes and the metallization lining the other surfaces of the block form lengths of transmission line, which are well known in the art as being electrically equivalent to distributed inductive and capacitive elements and are quite useful as filter elements.

These so-called ceramic block filters have been used for some time in two-way communications devices, such as cellular telephones and conventional two-way trunked radios. Their electrical characteristics (such as their operation as either bandpass, lowpass, highpass, or bandstop filters) are controlled in part by the physical dimensions of the block, including particularly its height, as well as so-called top patterning on the unmetallized top surface. Spacing between the holes as well as the diameter of the holes also affects the frequency characteristics of the block filter as well.

It is well known that these block filters out-perform discrete, or lumped, inductive and capacitive elements, particularly so at high frequencies, i.e., at or near 800 Mhz. and above. They are mechanically stable, relatively easy to produce and tune, and are capable of operating at relatively high power levels.

As prevalent as ceramic block filters are, however, it is relatively difficult to design and manufacture a relatively narrow bandwidth bandpass filter as a ceramic block filter. Surface acoustic wave devices, or SAWs, which have also been well known in the art for sometime, are generally characterized as capable of having relatively narrow bandpass frequency ranges, but unfortunately, SAWs are also relatively fragile and difficult to package.

Future two-way communications devices such as cellular telephones and conventional and two-way trunked radios, as well as perhaps selective call receivers (pagers) might benefit from a combination of both ceramic and SAW filter technologies. In a transmitter in a two-way communications device, a ceramic block filter could have the required capability to handle relatively large input power levels while the receiver in such a device might benefit from the increased selectivity provided by a surface acoustic wave device. A packaging structure that accommodates both devices might facilitate the adoption of their combination in such devices more readily.

BRIEF DESCRIPTION OF THE DRAWINGS

FIG. 1 shows a simplified block diagram of a two-way radio communications device.

FIG. 2 shows a perspective view of a ceramic block filter including a surface acoustic wave device mounted in a cavity formed in a side of the block filter.

FIG. 3 shows a perspective view of a so-called ceramic duplexer comprising a block of material and a plurality of SAW devices each mounted into a cavity formed in the side of the block filter comprising the duplexer.

DESCRIPTION OF A PREFERRED EMBODIMENT

FIG. 1 shows a simplified block diagram of a two-way radio communications device (10). This radio communications device (10) might comprise a cellular telephone, for example, but also might depict a conventional or trunked two-way radio. (In the case of a selective call receiver or pager, the transmitter stages depicted in FIG. 1 would of course be unnecessary.)

The communications device (10) includes a simplified transmitter section comprised of a microphone (30), the signals of which are coupled into a modulator device (28). (The modulator could be any well-known combination of circuits used to modulate a radio frequency wave by the information input to the microphone. In addition, those skilled in the art will recognize that the microphone (30) might just as well be a data device while the modulator device will also be well known to those skilled in the art.)

In FIG. 1, the output of the modulator (28), which in most radio communications devices is typically at a relatively low power level, is coupled into a SAW filter (26), in part, to suppress unwanted harmonics or other spurious signals output from the modulator (28). In some radios (10) the SAW (26) might also provide impedance matching between the modulator (28) and the power amplifier (24).

(SAW filters are well known in the art and only a superficial description of them is given here. Numerous sources are available to describe their structure and operation elsewhere.)

A SAW filter, which is well known in the art, is typically comprised of a first set of closely-spaced, electrically conductive traces that resemble fingers, closely spaced from a second set of complimentary, interdigitated output conductive traces. Both sets of fingers are typically deposited onto the surface of a piezoelectric substrate.

In FIG. 1, signals that pass through the SAW filter (26) are coupled into a final power amplifier stage (24). The design and construction of the power amplifier stage (24) might be any circuit or combination of circuits well known in the art that are capable of amplifying an RF input signal from the SAW filter and boosting its power amplitude to an appropriate level for broadcast from the antenna (12).

Inasmuch as most power amplifier devices generate undesired sidebands and other spurious signals, the signals output from the power amplifier stage (24) are filtered by a ceramic block filter 16) as shown in FIG. 1. The ceramic block filter (16) might be comprised of one or more bandpass filter stages that are embodied in structures such as that shown in U.S. Pat. No. 4,431,977 to Sokola et al. for "Ceramic Bandpass Filter," issued Feb. 14, 1984.

Signals that pass through the ceramic block (16) are coupled to an antenna (12) through a length of transmission line (13) as shown. Radio frequency signals emitted from the antenna (12) to another similar radio communications device elsewhere.

As is common in full-duplex communications devices today, a so-called duplexer (identified in FIG. 1 by reference numeral 14) permits the transmitter and receiver sections to share a single antenna. In FIG. 1, the filter stage identified by reference numeral 18, in part, blocks signals emitted from the power amplifier (24) of the transmitter from the relatively delicate SAW (20) and the circuitry of the first amplifier and mixer (22). Similarly, the filter stage identified by reference numeral 16 suppresses unwanted sidebands, harmonics and other spurious signals generated in the preceding stages of the transmitter.

In full-duplex communications devices such as cellular telephones, transmit and receive frequencies are separated from each other. In a duplexer, the transmit section bandpass filter stage (16) has a center frequency substantially different from the center frequency of the receiver section filter stages (18 and 20). In one application of the invention disclosed herein, one ceramic block filter (16), in combination with a second ceramic block filter stage (18) and a surface acoustic wave device (20) might be considered to be a duplexer, which is by reference numeral (14).

The simplified two-way communications device (10) of FIG. 1 is comprised of the ceramic block filter (18), an surface acoustic wave device (20) and at least an amplifier premixer stage (22) as well as a speaker (23). The first ceramic block filter stage (18), which as described above is preferably part of a single block duplexer but which also might be a separate block filter, is required to be electrically ahead of the surface acoustic wave device (20) because most surface acoustic wave devices (20) are unable to adequately dissipate power levels emitted from the final amplifier power amplifier stage (24). The ceramic block filter stage (18) effectively isolates the SAW (20) from output signals from the power amplifier stage (24) that pass through the ceramic block filter (16).

Inasmuch as both the surface acoustic wave devices shown in FIG. 1 (26 and 20) require packaging and must be housed in a container in a radio communications device, the invention disclosed herein lies in using a block of ceramic that comprises a block filter (16 and 18) to carry the SAW filters as well. By using a ceramic block filter as a housing for the SAW devices, a substantial space savings can be realized as well as providing a rugged means for housing the SAW devices.

Turning to FIG. 2 there is disclosed a perspective view of a ceramic block filter and surface acoustic wave device housing structure (15). This structure (15) is comprised of a first ceramic block (150) that is shaped substantially as a parallelepiped. The block (150) has a plurality of holes (152) that extend from the top surface of the block (151) through the block to the bottom surface (155). With the exception of the top surface (151), all of the exterior surfaces of the block (150) as well as the surfaces within the through holes (152) are coated with an electrically conductive material (metallized). An input pad (154 or 156) and an output pad (156 or 154) permit signals to be electrically coupled into the electrical filter stages (which stages are comprised of the metallized through holes) where the electrical filtering takes place.

In the embodiment shown in FIG. 2 the input and output terminals (154 and 156) are located on a side surface of the parallelepiped and are shown in FIG. 2 on the side that is visible. Unmetallized regions (157) surround both input/output paths (154 and 156) permitting the input/output paths to be electrically isolated from the metallization covering the exterior surfaces of the block.

The block (150) includes a recess or cavity (158) formed in one side of the block, which recess or cavity (158) is sized and shaped to accept a substrate for a surface acoustic wave device (SAW) (160). (Alternate embodiments of the invention would certainly include recesses formed in more than one side surface as well as forming recesses in both the top and bottom surfaces as well.) The SAW substrate (161) depicted in FIG. 2 is typically a substantially square piece of piezoelectric material having at least first and second planar surfaces. Alternate embodiments of the SAW substrate depicted in FIG. 2 would also include round or other geometric shapes. The substrate (161) of course typically includes at least one SAW device coupled to at least one surface of the substrate (161) that is to be enclosed within the cavity (158).

Electrical shielding or isolation of the SAW device on the surface acoustic wave device substrate (161) can be enhanced by applying a metallization layer (a shield) to the interior surfaces within the cavity (158), which metallization is not shown in FIG. 2 for clarity purposes.

Turning to FIG. 3 there is depicted an alternate embodiment of a ceramic block filter structure housing a plurality of SAW devices (14). In FIG. 3, the ceramic filter stage identified in FIG. 1 by reference numeral 14 is identified in FIG. 3 by reference numeral 142-1. Alternate embodiments of such a filter stage would of course include multi-hole filters. In FIG. 3, the transmitter filter (identified in FIG. 1 by reference numeral 16) is comprised of a plurality of through holes (142). As is common in most ceramic block filters, top surface metallization patterning (metallization 144 on the top surface 141 of the block 140) can be used to determine the electrical characteristics of the block filter stages.

In FIG. 3 the block (140) is used to carry three surface acoustic wave devices (162, 164 and 166). Two of these SAW devices (162 and 164) are shown with conductive traces between them (163) which conductive traces might be considered as a means for coupling electrical signals between the SAW devices (162 and 164). The two SAW devices identified by reference numerals 162 and 164 might comprise the SAW filter identified in FIG. 1 by reference numeral 20 and be used to filter electrical signals ahead of the amplifier mixer stage (22).

As described above, the ceramic prefiltering stage identified in FIG. 1 by reference numeral (18) might, for example, be embodied by the through hole embodied in FIG. 3 by reference numeral (142-1). A conductive trace between conductive patterning adjacent to the hole (142-1) on the top surface (141) and identified by reference numeral 165 might be considered a means for coupling electrical signals between the block filter and the SAW device identified by reference numeral (162). This conductive patterning (165), as well as the side patterning (163) can be deposited onto the surfaces of the block (140) by any appropriate means including spraying or screen printing for example. This patterning (163 and 165) permits electrical signals to pass between the respective filter stages (both SAW and holes).

Those skilled in the art will recognize that the embodiment depicted in FIG. 3, as well as in FIG. 2, has an input and an output embodied by the side-located conductive pads (146 and 148 in FIG. 3 and 154 and 156 in FIG. 2). Each SAW filter device will have at least one input port and at least one output port as well.

The SAW filter devices depicted in FIG. 3 will preferably have input and an output ports or terminals that are accessible after the SAW substrate is fixed into the blocks. (The substrates (161) might be fixed in place by any appropriate means, including any appropriate adhesive.) Such input/output terminals are identified by reference numeral 167.

Those skilled in the art will recognize that the transmission line identified by reference numeral (13) of FIG. 1 is a structure for coupling electrical signals received on the antenna (12) to the input of the ceramic block filter (18). The conductive traces on the surface of the block shown in FIG. 3 and identified by reference numerals (163 or 165) provide for coupling electrical signals to and from the ceramic block filter (18) to an input of the SAW devices (162, 164, or 166) for example. Similarly, the conductive traces identified in FIG. 3 by reference numeral (163) provide for coupling electrical signals from the transmitter (which transmitter is comprised in part of the modulator (28) and the microphone (30), and the output of the SAW filter stage (26) to the input of the first ceramic block filter (16). In FIG. 3 this ceramic block filter stage identified by reference numeral (16) could very well be comprised of through holes identified in FIG. 3 by reference numeral (142).

While the preferred embodiment of the invention is the inclusion of one or more SAWs into a ceramic block filter, those skilled in the art will recognize the advantages and feasibility of mounting other electronic devices into a ceramic block filter. The substrate (160) shown in FIG. 1 could just as well be any electronic device, such as an integrated circuit (IC) for example. In addition to mounting a single IC, multiple ICs, speakers, microphones, etc., might be mounted within a single block, using a structure such as that shown in FIG. 3.

Still other embodiments of the preferred embodiment of the inventive concept disclosed herein would include the adaptation of a ceramic block (150) to carry other acoustic wave devices, and not just surface acoustic wave devices. Some other acoustic wave devices that might be mounted within a cavity (158) formed in the block (150) would include for example leaky acoustic wave, bulk acoustic wave, thin film acoustic wave, surface skimming acoustic wave, acoustic transport devices (ACT) and magnetoacoustive wave filters, to name a few.

Those skilled in the art will recognize that the invention disclosed herein, namely the combined packaging of a surface acoustic wave device into a ceramic block in which is embodied at least one ceramic block filter, provides a structure that substantially reduces the volume otherwise required to separately house surface acoustic wave devices in a radio communications device. By mounting surface acoustic wave device substrates within the ceramic block that comprises a ceramic block filter, a surface acoustic wave device can be securely or rigidly mounted, can be manufactured into a radio communications device using so-called surface mount technology, while providing a physically secure mounting structure to the SAW device as well as reducing used volume.

What is claimed is:

1. A filter comprised of:
    a first ceramic block filter having an input and an output, said first filter comprised of a parallelepiped block of ceramic material having top, bottom, and side surfaces, the exterior surfaces of which, except for the top surface, are substantially coated with conductive material (metallized), said parallelepiped block including at least one metallized hole extending through said top and bottom surfaces, the metallization of said hole being electrically coupled to metallization on the exterior surfaces of the block at only the bottom surface of said block, said block further including at least one cavity formed in at least one side of said parallelepiped block;
    at least one electronic device, said electronic devices being sized and shaped to fit substantially within said cavity;
    means for coupling electrical signals between said first ceramic block filter and said at least one electronic device.

2. The apparatus of claim 1 where said electronic device is an integrated circuit device.

3. The apparatus of claim 1 where said electronic device is an acoustic wave device.

4. A filter comprised of:
    a first ceramic block filter having an input and an output, said first filter comprised of a parallelepiped block of ceramic material having top, bottom, and side surfaces, the exterior surfaces of which, except for the top surface, are substantially coated with conductive material (metallized), said parallelepiped block including at least one metallized hole extending through said top and bottom surfaces, the metallization of said hole being electrically coupled to metallization on the exterior surfaces of the block at only the bottom surface of said block, said block further including at least one cavity formed in at least one side of said parallelepiped block;
    at least one accoustic wave device substrate, said substrate having at least first and second surfaces, said substrate including an accoustic wave device coupled to at least one of said first and second surfaces, said at least one accoustic wave device having an input and an output, said substrate being sized and shaped to fit substantially within said cavity;
    means for coupling electrical signals between said first ceramic block filter and said at least one accoustic wave device.

5. The apparatus of claim 4 where said accoustic wave device is a surface accoustic wave (SAW) device.

6. The apparatus of claim 4 where said accoustic wave device is a leaky accoustic wave device.

7. The apparatus of claim 4 where said accoustic wave device is a bulk accoustic wave (BAW) device.

8. The apparatus of claim 4 where said accoustic wave device is a thin film integrated accoustic wave device.

9. The apparatus of claim 4 where said accoustic wave device is a surface skimming bulk wave device.

10. The apparatus of claim 4 where said accoustic wave device is an accoustic charge transport device.

11. The apparatus of claim 4 where said means for coupling electrical signals between said first ceramic block filter and said at least one SAW device includes at least one layer of conductive material on a surface of said block, extending between said input and output of said at least one SAW device and said input and output of said block filter.

12. The apparatus of claim 4 where said input and output terminals of said block filter include areas of conductive material on at least one side of said block, said areas of conductive material being electrically isolated from the metallization covering said external surfaces of said block.

13. The apparatus of claim 4 where said means for coupling electrical signals between said first ceramic block filter and said at least one acoustic wave device couples the output of said first block filter to the input of said at least one acoustic wave device.

14. The apparatus of claim 4 where said means for coupling electrical signals between said first ceramic block filter and said at least one acoustic wave device couples the output of said at least one acoustic wave device to the input of said first block filter.

15. The apparatus of claim 4 further comprised of:
a second ceramic block filter within said parallelpiped block of ceramic material, said second block filter having an input and an output and comprised of at least one metallized hole extending between the top and bottom surfaces of said parallelepiped block;
means for coupling signals between said second ceramic block filter and said at least one acoustic wave device.

16. The apparatus of claim 4 further comprised of a means for electrically shielding said acoustic wave device within said cavity.

17. The apparatus of claim 4 where said input and output of said at least one acoustic wave device includes a plurality of electrical contact surfaces on at least one of said first and second surfaces of said acoustic wave device filter substrate.

18. A filter comprised of:
a first ceramic block filter having an input and an output, said first filter comprised of a parallelepiped block of ceramic material having top, bottom, and side exterior surfaces of which, except for the top surface, are substantially coated with conductive material (metallized), said parallelepiped block including at least one metallized hole extending through said top and bottom surfaces, the metallization of said hole being electrically coupled to metallization on the exterior surfaces of the block at only the bottom surface of said block, said block further including at least one cavity formed in at least one side of said parallelepiped block;
a second ceramic block filter, having an input and an output, said second filter comprised of at least a second metallized hole extending through said top and bottom surfaces of said parallelepiped block;
at least one surface accoustic wave (SAW) filter substrate including a SAW device coupled thereto, said at least one SAW device having an input coupled to the output of said second ceramic block filter and an output coupled to the input of said first ceramic block filter, said substrate being sized and shaped to fit substantially within said cavity;
means for coupling electrical signals between said first ceramic block filter and said at least one SAW device; and
means for coupling electrical signals between said second ceramic block filter and said at least one SAW device.

19. The apparatus of claim 18 where said means for coupling electrical signals between said first ceramic block filter and said at least one SAW device and between said second ceramic block filter and said at least one SAW device includes conductive material deposited onto a surface of said block.

20. In a radio communications device comprised of: at least one antenna, a radio signal transmitter means for generating radio frequency signals to be broadcast from said antenna and a radio signal receiver means for demodulating radio frequency signals received on said antenna to audio frequency signals, an improvement comprised of:
a first ceramic block filter having an input and an output, said first filter comprised of a parallelepiped block of ceramic material having top, bottom, and side surfaces, the exterior surfaces of which, except for the top surface, are substantially coated with conductive material (metallized), said parallelepiped block including at least one metallized hole extending through said top and bottom surfaces, the metallization of said hole being electrically coupled to metallization on the exterior surfaces of the block at only the bottom surface of said block, said block further including at least one cavity formed in at least one side of said parallelepiped block;
a second ceramic block filter, having an input and an output, said second filter comprised of at least a second metallized hole extending through said top and bottom surfaces of said parallelepiped block;
at least one surface accoustic wave (SAW) filter substrate including a SAW device coupled thereto, said at least one SAW device having an input coupled to the output of said second ceramic block filter and having an output, said substrate being sized and shaped to fit substantially within said cavity;
means for coupling electrical signals from said transmitter means to the input of said first ceramic block filter; and
means for coupling electrical signals received on said antenna to said input of said second ceramic block filter;
means for coupling electrical signals at said output of said second ceramic block filter to the input of said at least one SAW device; and
means for coupling the output of said SAW device to said receiver means.

* * * * *

UNITED STATES PATENT AND TRADEMARK OFFICE
CERTIFICATE OF CORRECTION

PATENT NO. : 5,254,962

DATED : October 19, 1993

INVENTOR(S) : Morris et al.

It is certified that error appears in the above-identified patent and that said Letters Patent is hereby corrected as shown below:

In the Title: between the words "combined" and "acoustic", insert the word --surface--.

Signed and Sealed this

Twelfth Day of July, 1994

Attest:

BRUCE LEHMAN

Attesting Officer

Commissioner of Patents and Trademarks